United States Patent
Kerl

(10) Patent No.: US 6,597,628 B1
(45) Date of Patent: Jul. 22, 2003

(54) AUTO-DISABLE RECEIVE CONTROL FOR DDR RECEIVE STROBES

(75) Inventor: Daniel L. Kerl, Huntsville, AL (US)

(73) Assignee: 3DLabs, Inc., Ltd, Hamilton (BM)

( * ) Notice: Subject to any disclaimer, the term of this patent is extended or adjusted under 35 U.S.C. 154(b) by 0 days.

(21) Appl. No.: 10/114,408

(22) Filed: Apr. 2, 2002

Related U.S. Application Data

(60) Provisional application No. 60/346,504, filed on Jan. 8, 2002.

(51) Int. Cl.[7] .................................................. G11C 8/00
(52) U.S. Cl. .................. 365/233; 365/193; 365/230.02; 365/230.06
(58) Field of Search ............................ 365/233, 230.02, 365/230.06, 230.08, 230.04, 191, 193, 189.02, 189.05

(56) References Cited

U.S. PATENT DOCUMENTS

| | | | |
|---|---|---|---|
| 6,016,283 A | 1/2000 | Jeong .......................... 365/233 |
| 6,044,032 A | 3/2000 | Li .......................... 365/230.03 |
| 6,081,477 A | 6/2000 | Li .............................. 365/233 |
| 6,125,078 A | 9/2000 | Ooishi et al. ................ 365/233 |
| 6,144,617 A | * 11/2000 | Takai ...................... 365/233.5 |
| 6,147,927 A | * 11/2000 | Ooishi ........................ 365/233 |
| 6,154,419 A | 11/2000 | Shakkarwar ................. 365/235 |
| 6,279,073 B1 | * 8/2001 | McCracken et al. ......... 711/105 |
| 6,363,030 B1 | * 3/2002 | Ooishi ........................ 365/233 |
| 6,381,194 B2 | * 4/2002 | Li .............................. 365/233 |

* cited by examiner

Primary Examiner—Hoai Ho
Assistant Examiner—Gene N. Auduong
(74) Attorney, Agent, or Firm—Arnall Golden Gregory LLP

(57) ABSTRACT

A system for ensuring that erroneous data is not improperly latched in a gate when reading data from a DDR-SDRAM. The system is preferably a circuit that employs the last falling edge of a receive strobe to stop further variation of the receive strobe from affecting a new receive strobe signal.

8 Claims, 3 Drawing Sheets

AUTO-DISABLE RECEIVE CONTROL FOR DDR RECEIVE STROBES

CROSS-REFERENCE TO RELATED APPLICATION

This invention claims priority to the provisional application, AUTO-DISABLE RECEIVE CONTROL FOR DDR RECEIVE STROBES, Ser. No. 60/346,504, filed on Jan. 8, 2002.

BACKGROUND OF THE INVENTION

1. Field of the Invention

The present invention generally relates to computer systems. More specifically, the present invention relates to the control of a receive strobe in a computer circuit.

2. Description of the Related Art

Speed has always been an important factor in measuring the performance of a computer system, and speed depends, among other factors, how fast a central processing unit (CPU) can perform mathematical calculations, and how fast can data be retrieved from and stored into data registers.

Data are stored into the data registers or memory locations with help of a strobe signal. The data can be latched to their location by either the rising edge or the falling edge of a strobe signal. To achieve a high data rate, a Double-Data-Rate Synchronous Dynamic Random Access Memory (DDR-SDRAM or DDR) has been used. DDR differs from standard DRAM (SDRAM) in that it uses a separate strobe signal by which some or all of its data timing is referenced, and both the rising and the falling edges of the strobe signal are used to clock data into its destination. Using both edges of the strobe signal to transfer data thus doubles the amount of data transferred in a given time interval. This technique also allows higher data rates than standard single-data-rate SDRAM because the explicit strobe signal by which data is referenced can be used to remove some of the timing uncertainty present in the data receive path.

The strobe is a bi-directional signal, which is driven along with the data, and can be driven by either a controller or the DDR. If the controller wants to store (write) a data into the DDR, the controller drives the strobe to indicate the availability of the data on the data bus. If the controller is retrieving (reading) data from the DDR, the DDR controls the strobe to indicate the data is available on the data bus. This implies that neither the controller nor the DDR drives the strobe during time intervals between reads and writes. This results in the strobe signal being in a high-impedance state, usually at an indeterminate logic level, when not driven by either the controller or the DDR. Since the edges of the strobe are used to clock in receive data during reads, the propagation of this indeterminate level is troublesome. At this indeterminate level, the strobe may lead to an unintended edge at the receiving end which will latch an unexpected data.

Thus, a more precise system of blocking the reception of the strobe signal is needed at high clock speeds. It is to such a system and method that the present invention is primarily directed.

SUMMARY OF THE INVENTION

The present invention discloses a circuit and method for using the last falling edge of a receive strobe to block further reception of additional signals from the receive strobe.

According to one embodiment of the present invention a dedicated circuit that uses a phase signal, a receive enable strobe, a 2X clock signal, and a receive strobe from an I/O receiver to generate a new receive strobe for use by a data latch. The phase signal is a late clock signal, and the 2X clock signal is twice as fast as the system clock. The receive enable strobe is synchronous with the system clock.

The circuit includes several latches and ensures the last latch is gated asynchronously from the receive strobe and is clocked at the falling edge of the receive strobe. The output of this last latch is ANDed with the receive strobe and generates the new strobe for the DDR-SDRAM. This ensures the new strobe remains at a logic level that is unknown instead of undetermined, thus eliminating the unwanted latching at the receiving end.

The circuit according to the present invention changes the way the receive strobe is connected between a received data latch and the DDR-SDRAM. The receive strobe connection between the received data latch and the DDR-SDRAM is replaced by the circuit according to the present invention. The circuit receives the receive strobe from a bi-directional I/O buffer and generates a new receive strobe to a data latch delay system. The new receive strobe is used as a clock in the received data latch to clock the data from the DDR-SDRAM.

The circuit according to the present invention can be integrated inside of an application specific integrated circuit (ASIC) or inside of the DDR-SDRAM.

Other objects, features, and advantages of the present invention will become apparent after review of the hereinafter set forth Brief Description of the Drawings, Detailed Description of the Invention, and claims appended herewith.

DETAILED DESCRIPTION OF THE INVENTION

Figure 1:
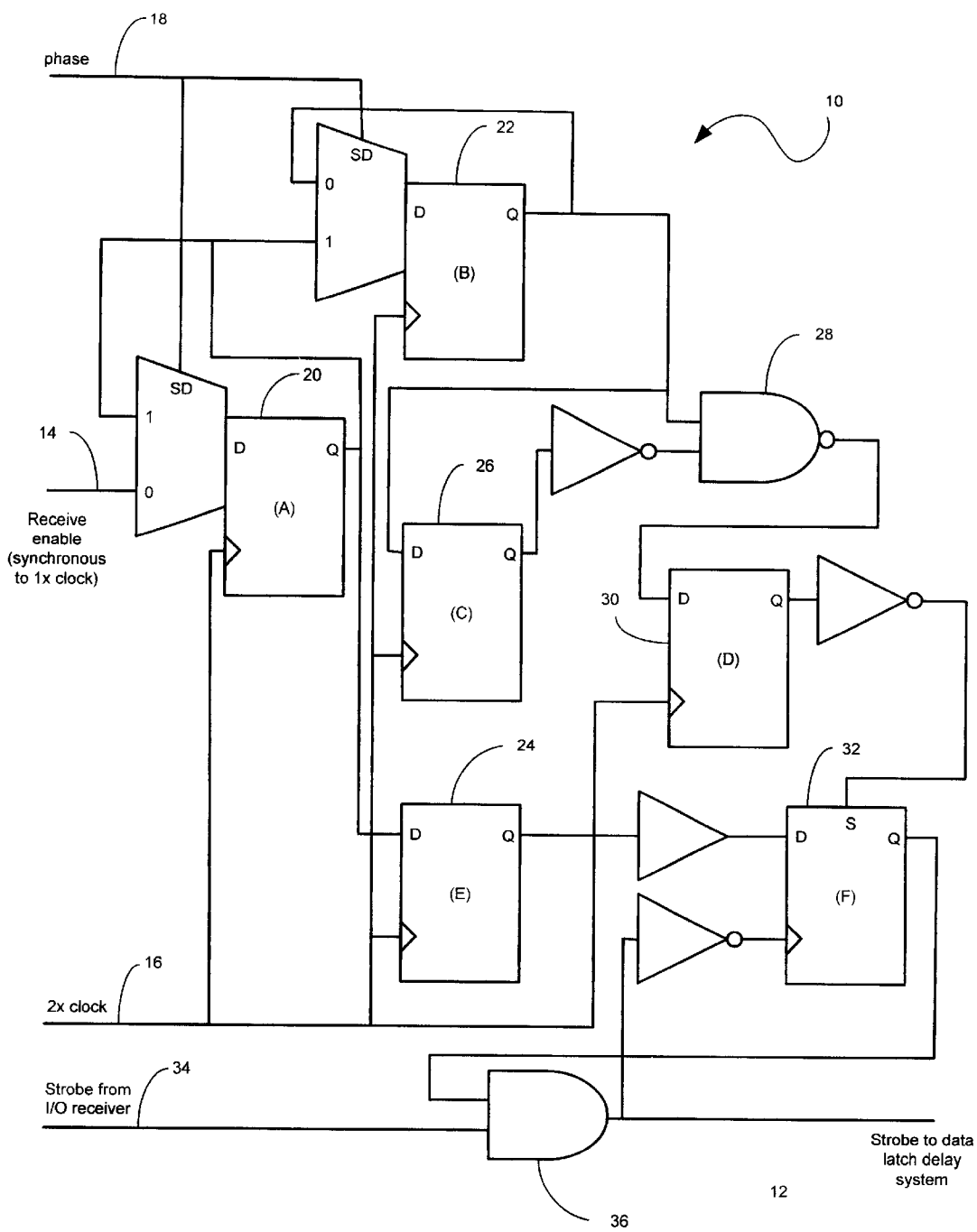
FIG. 1 is a schematic diagram for one embodiment of the present invention.

Referring now in more detail to the drawings in which like numerals refer to like elements throughout the several figures, FIG. 1 is a schematic diagram for one circuit 10 that generates a new strobe 12, which remains in a known digital state while not in use, according to the present invention. The operation of the circuit 10 is controlled by a receive enable signal 14 that is synchronous to a common clock. A 2X clock 16 and a phase signal 18 are also used in this design. Note that all signals transmitted to the DDR-SDRAM, including its differential clock, also known as the phase signal, are also referenced to the 2X clock.

Multiplex latch (A) 20 aligns the receive enable signal 14 with the 2X clock 16. The output of this latch 20 is fed to multiplex latch (B) 22 and latch (E) 24. The output of latch (B) 22 is fed to latch (C) 26 and to a NAND gate 28. Latches (B), (C), and (D) are gated by 2X clock 16.

The output from the NAND gate 28 and the inverted output from latch (C) are fed to latch (D) 30, which is clocked by 2X clock 16. The inverted output from latch (D) 30 is a one-2X-clock-long pulse that asynchronously sets gate latch (F) 32. The output of latch (A) 20 also is delayed at latch (E) 24, and then applies to the data port of gate latch (F) 32. Since gate latch (F) 32 is set asynchronously, subsequent strobe transitions are observable at the clock port on gate latch (F) 32. Gate latch (F) 32 is then clocked at the falling edge of the receive strobe.

Figure 2:
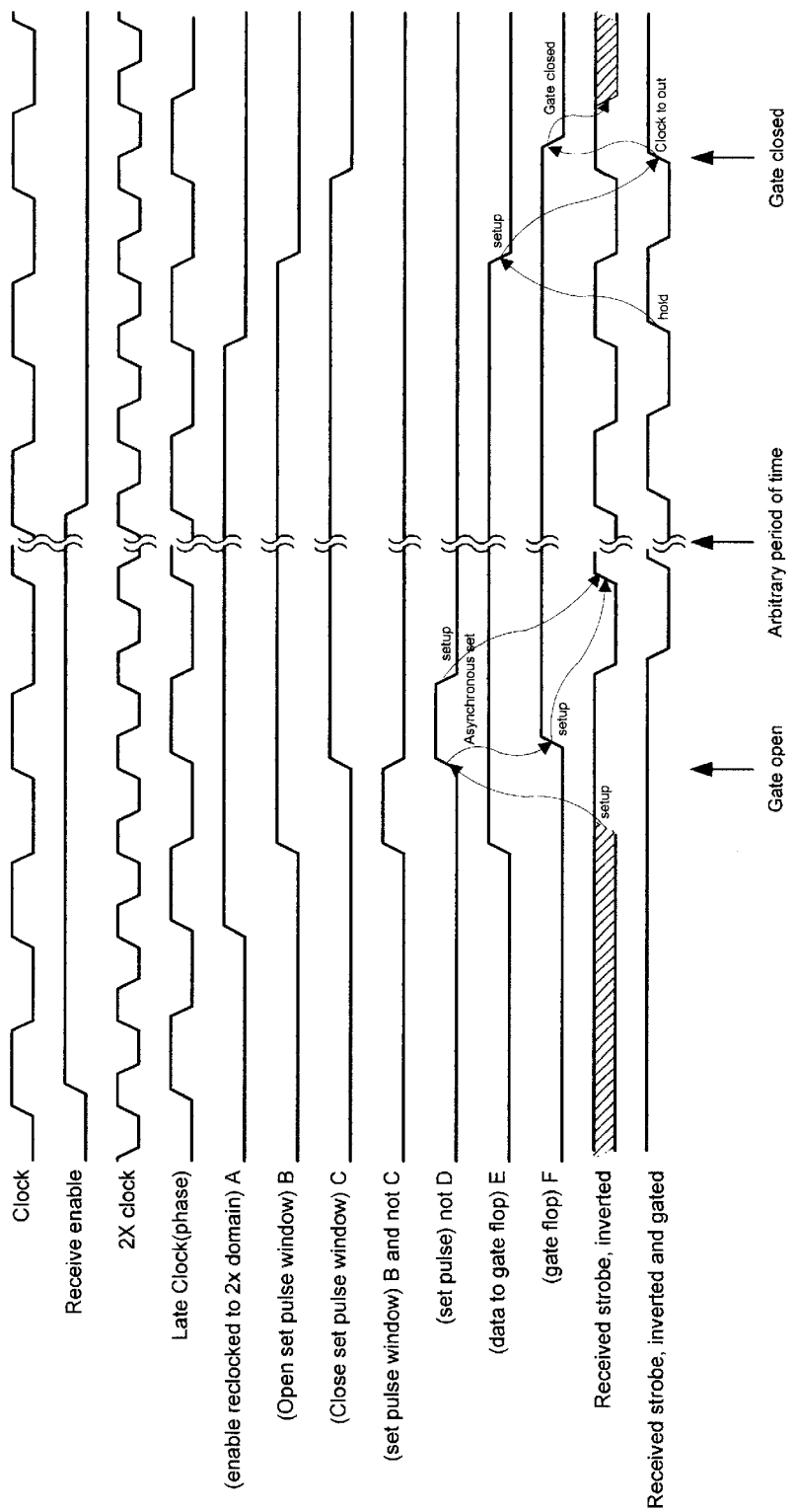
FIG. 2 is a timing diagram for one embodiment of the present invention.

FIG. 2 illustrates a timing diagram for the circuit in FIG. 1. The set pulse is the output from latch (D) 30 after the inverter. The circuit ensures the set pulse is generated after the receive strobe 34 is driven by DDR-SDRAM or a controller. The set pulse sets gate latch (F) 32 and the output of gate latch (F) 32 enables AND gate 36 to let the receive strobe to pass through. When this happens, the AND gate 36 is open. The AND gate is closed when the receive enable 14 is negated and propagates through latch (E) 24 and gated to gate latch (F) 32 by the last falling edge of the receive strobe 34. The output of gate latch (F) 32 immediately feeds to the AND gate 36, thus closing it. After the AND gate is closed, the new strobe 12 is immune from the state of the receive strobe 34.

Figure 3:
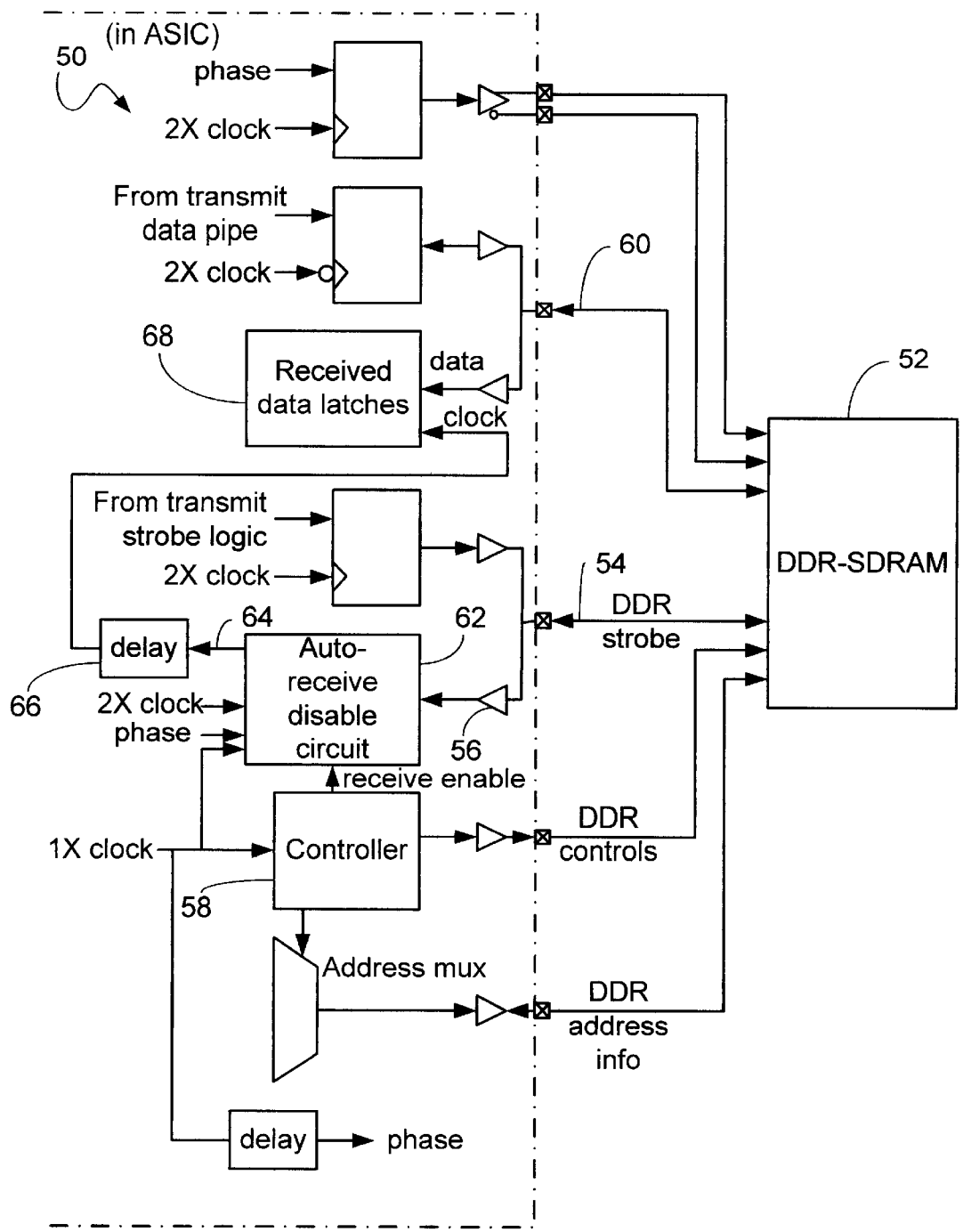
FIG. 3 is a schematic diagram of a read access circuit inside an ASIC employing an auto-disable circuit according to the present invention.

FIG. 3 is an illustration of an ASIC 50 reading data from a DDR-SDRAM device 52. The receive strobe (DDR strobe) 54 is received at the I/O receiver 56. When the DDR-SDRAM 52 has retrieved a data requested by the controller 528, the DDR-SDRAM 52 puts data onto the data path 60, and activates receive strobe 54. The receive strobe 54 passes through the bi-directional I/O receiver 56 and feeds to an auto-disable circuit 62. The auto-disable circuit 62 generates a new strobe signal 64 that feeds through a data latch delay system 66, then to the received data latch 68. The received data latch 68 uses this new strobe signal to clock the data. A similar circuit can be built into the DDR-SDRAM to ensure that DDR-SDRAM will not latch wrong data during a store operation.

In the embodiment disclosed by this invention, as long as receive enable signal 14 from the synchronous controlling logic remains active, gate latch (F) 32 will remain high while being clocked. The controller or the DDR-SDRAM will negate the receive enable 14 at the appropriate time to ensure that the data port on gate latch (F) 32 goes low between the second-to-last and last falling edges of the strobe 34. When the last falling edge of the receive strobe 34 is received, gate latch (F) 32 goes low, subsequently closing the AND gate 36 and rendering circuitry downstream insensitive to further transitions of the receive strobe 34.

The controller must assert its receive enable 14 such that gate latch (F) is asynchronously set after the receive strobe 34 is driven low by the DDR-SDRAM that is being read. The controller must deassert its receive enable 14 such that the data port to gate latch (F) 32 is deasserted after the second-to-last falling edge and before the last falling edge of the receive strobe 34. The clock path to gate latch (F) 32 must be faster than the falling-edge-to-float time from the DDR-SDRAM that is being read.

While the invention has been particularly shown and described with reference to preferred embodiments thereof, it will be understood by those skilled in the art that various other changes in form and detail may be made without departing from the spirit and scope of the invention.

What is claimed is:

1. An apparatus for driving a receive strobe signal for a double-data-rate memory storage device in a computing system, wherein the receive strobe signal remains at a defined digital level when it is not driven by the double-data-rate memory storage device, the apparatus comprising:

a plurality of multiplex latches, each multiplex latch having a selector input, wherein the selector input is driven by a phase signal, each multiplex latch being clocked by a 2X clock, one of the multiplex latches having a receive enable signal as one of its inputs, wherein the receive enable signal is synchronous to a system clock;

a plurality of latches, wherein at least two latches have inputs connected to outputs of the multiplex latches;

a gate latch, wherein the gate latch is set by an inverted output from one of the latches; and an AND gate having at least a first input and a second input, the first input of the AND gate is connected to the receive strobe signal and the second input of the AND gate is connected to an output of the gate latch.

2. The apparatus according to claim 1, wherein the gate latch is clocked by an inverted output of the AND gate.

3. A method for latching data in a received data latch of a double-data-rate memory storage device in a computing system, said method comprising the steps of:

providing a controller in the memory storage device;

receiving a receive strobe at the data latch from a DDR-SDRAM;

generating an outgoing receive strobe; and connecting the outgoing receive strobe to the received data latch.

4. The method according to claim 3, wherein the connecting step further comprises connecting the outgoing receive strobe to a data latch delay system; and connecting the output of the data latch delay system to the received data latch.

5. The method according to claim 3, further comprising the step of connecting a 2X clock to the apparatus.

6. A method according to claim 3, further comprising the step of connecting a phase signal to the apparatus.

7. A method according to claim 3, further comprising the step of connecting a receive enable signal from a controller to the apparatus.

8. A method for disabling a receive strobe signal in a system where data is read from a double-data-rate memory storage device including a plurality of latches, and wherein the device is latched into a received data latch using the receive strobe signal, said method comprising the steps of:

receiving the receive strobe from a DDR-SDRAM;

receiving a phase signal;

receiving a receive enable signal;

receiving a 2X clock;

generating a setup pulse through use of one or more of the plurality of latches;

setting a gate latch using the setup pulse;

clocking the gate latch with a last falling edge of the receive strobe; and disabling at least one gate with an output from the gate latch.

* * * * *